(12) United States Patent
Ritter et al.

(10) Patent No.: US 8,390,971 B2
(45) Date of Patent: Mar. 5, 2013

(54) PROTECTION FOR AN INTEGRATED CIRCUIT

(75) Inventors: Hans-Martin Ritter, Nahe (DE); Ingo Laasch, Hamburg (DE)

(73) Assignee: NXP B.V., Eindhoven (NL)

( * ) Notice: Subject to any disclaimer, the term of this patent is extended or adjusted under 35 U.S.C. 154(b) by 157 days.

(21) Appl. No.: 13/063,189

(22) PCT Filed: Sep. 9, 2009

(86) PCT No.: PCT/IB2009/053942
§ 371 (c)(1),
(2), (4) Date: Mar. 9, 2011

(87) PCT Pub. No.: WO2010/029503
PCT Pub. Date: Mar. 18, 2010

(65) Prior Publication Data
US 2011/0216459 A1    Sep. 8, 2011

(30) Foreign Application Priority Data

Sep. 11, 2008 (EP) .................... 08105316

(51) Int. Cl.
*H02H 3/20* (2006.01)
*H02H 3/22* (2006.01)
*H02H 9/00* (2006.01)

(52) U.S. Cl. .................... 361/91.1; 361/56; 361/111

(58) Field of Classification Search ................ 361/91.1, 361/56, 111
See application file for complete search history.

(56) References Cited

U.S. PATENT DOCUMENTS

| | | | |
|---|---|---|---|
| 5,315,472 A | 5/1994 | Fong et al. | |
| 5,637,901 A | 6/1997 | Beigle et al. | |
| 6,635,931 B1 | 10/2003 | Wang | |
| 6,835,984 B2 | 12/2004 | Derkits, Jr. et al. | |
| 6,933,562 B1 | 8/2005 | Hopper et al. | |
| 7,309,897 B2 * | 12/2007 | Yu et al. | 257/355 |
| 2007/0241406 A1 | 10/2007 | Yu et al. | |
| 2008/0006847 A1 | 1/2008 | Grombach et al. | |

FOREIGN PATENT DOCUMENTS

| | | |
|---|---|---|
| EP | 0 590 859 A2 | 4/1994 |
| WO | 01/20682 A1 | 3/2001 |
| WO | 01/50533 A1 | 7/2001 |

OTHER PUBLICATIONS

Avery, L. R., "Using SCR's as Transient Protection Structures in Integrated Circuits", EOS/ESD Symposium, 4 Pages (1983).
Chatterjee, Amitava, et al; "A Low-Voltage Triggering SCR for On-Chip ESD Protection at Output and Input Pads", IEEE Electron Device Letters, vol. 12, No. 1; 2 Pages (Jan. 1991).

(Continued)

*Primary Examiner* — Jared Fureman
*Assistant Examiner* — Lucy Thomas

(57) ABSTRACT

The present invention relates to a discharge structure for an overvoltage and/or overcurrent protection, in particular to a discharge structure for an electrostatic discharge (ESD) protection, for an integrated circuit (IC), and to an ESD protection device for an IC comprising such a discharge structure and to a method for making such a structure. The present invention particularly relates to such a discharge structure (50, 52) which comprises at least two discharge paths (40, 80) provided to conduct a current to a terminal (60), whereas substantially all of the discharge paths (40, 80) present substantially the same resistance for the current.

15 Claims, 12 Drawing Sheets

OTHER PUBLICATIONS

Chen, J.Z., et al; "Design Methodology for Optimising Gate Driven ESD Protection Circuits in Submicron CMOS Processes"; EOS/ESD Symposium; 10 Pages (1997).

Wolf, Heinrich, et al; "Analyzing the Switching Behavior of ESD—Protection Transistors by Very Fast Transmission Line Pulsing"; EOS/ESD Symposium, 10 Pages (1999).

Hutchins, David W., et al; "ESD: Standards or Real-World Conditions?", Environmental Engineering Standards; 6 Pages (Winter Mar. 2002).

Smith, Jeremy C., et al; "A MOSFET Power Supply Clamp With Feedback Enhanced Triggering for ESD Protection in Advanced CMOS Technologies"; EOS/ESD Symposium; 9 Pages (2003).

Feng, H., et al.; "Bonding-Pad-Oriented On-Chip Protection Structures for ICs"; IEEE; 4 Pages (2003).

Keppens, Bart, et al; "ESD Protection Solutions for High Voltage Technologies"; Sarnoff Europe, Belgium; 10 Pages.

International Search Report and Written Opinion for Application PCT/IB2009/053942 (Oct. 2010).

\* cited by examiner

PROTECTION FOR AN INTEGRATED CIRCUIT

FIELD OF THE INVENTION

The present invention relates to a discharge structure for an overvoltage and/or overcurrent protection for an integrated circuit (IC), in particular for electrostatic discharge (ESD) protection for an (IC). The present invention also relates to an ESD protection device for an IC comprising such a discharge structure and to a method for making such a structure.

BACKGROUND OF THE INVENTION

Overvoltage and/or overcurrent processes, e.g. electrostatic discharge events (ESD events), are apt to cause severe damage in electronic equipment, e.g. an IC, arranged downstream a signal or power path, it being possible for the damage even to lead to complete failure of the respective equipment.

ESD protections are known from the prior art, for example as an IC with diode-connected transistor for reducing ESD damage disclosed in U.S. Pat. No. 5,637,901, as a semiconductor device disclosed in WO 01/20682 A1, as a bonding pad-oriented all-mode ESD protection structure disclosed in U.S. Pat. No. 6,635,931 B1, as an ESD resistant device disclosed in U.S. Pat. No. 6,835,984 B2, or as ground ring/spark gap ESD protection of tab circuits disclosed in U.S. Pat. No. 5,315,472.

SUMMARY OF THE INVENTION

It is an object of the present invention to provide enhanced overvoltage or overcurrent protection for an IC.

In a first aspect of the present invention it is presented a discharge structure for an ESD protection device for an IC, comprising at least two discharge paths provided to conduct a current caused by an ESD event to ground, whereas substantially all of the discharge paths present substantially the same resistance for the current.

In a further aspect of the present invention it is presented an ESD protection device for an IC, comprising an ESD protection circuit and at least one discharge structure, the discharge structure comprising at least two discharge paths provided to conduct a current to a terminal, whereas substantially all of the discharge paths present substantially the same resistance for the current.

In even further aspects of the present invention presented are a PCB comprising the afore-mentioned device, as well an electronic device comprising the aforementioned PCB.

In a further aspect of the present invention it is presented a method for making a discharge structure for an overvoltage and/or overcurrent protection for an IC, comprising the steps of providing at least two discharge paths being able to conduct a current to a terminal and ensuring that substantially all of the discharge paths present substantially the same resistance for the current.

A discharge structure preferably comprises at least 6 discharge paths, more preferably at least 12 discharge paths.

The resistance of a discharge path as a part of a discharge structure is preferably greater than 1 Ohm, more preferably greater than 2 Ohm.

The total resistance of a discharge structure is preferably substantially the resistance of one discharge path divided by the number of discharge paths in said discharge structure. This resistance is preferably smaller than 1 Ohm, more preferably smaller than 0.5 Ohm.

The ESD protection of the present invention preferably is a system level protection. Such protections are preferably provided at the input of the system, so as to protect the system against damage or breakdown due to overvoltage or overcurrent, e.g. due to electrostatic discharge, during use. It is particularly used in portable equipment such as mobile phones, portable computers etc, for at least one of following reasons: first, there are very many user interfaces, which increases the risk of overvoltage or overcurrent, e.g. of an ESD event. Secondly, a portable apparatus may be used even under harsh conditions, such as in a desert or when it is freezing. Thirdly, the electronic system is often located very near to the user interface. In view thereof, protections up to 15 kV, preferably at least for 1000 strikes, as measured in accordance with Human Base Model as known to the skilled person, are prescribed.

The present invention comprises the perception that it is an inherent problem in the design of ESD protections that todays ICs and other todays semiconductor devices are more than ever before extremely sensitive to high voltages that may be generated e.g. by contact with an ESD event. With process shrinks of the digital core in state of the art ICs using deep submicron technology much lower than 90 nm feature size, in particular overvoltage and overcurrent by ESD becomes very severe. As such, in particular ESD protection circuitry is essential for ICs.

An ESD event commonly results from the discharge of a high voltage potential of typically several kilovolts and leads to pulses of high current of typically several amperes of a short duration of typically 100 nanoseconds. Such an ESD event is generated within an IC for example by human contact with the leads of the IC or by electrically charged machinery being discharged in other leads of or to the IC. Today such ESD events are classified substantially by three different models, the human body model (HPM), the machine model (MM) and the charged device model (CDM). Each of those models is identified in the industrial standards MIL-STD-883 and IEC 61000-4-2. Such ESD events typically occur during installation of ICs into products, during packaging of such ICs or products or during using of such IC or products.

Since those ESD events may destroy the ICs and thus would require expensive repairs of the IC or the product the present invention has realized that it is desirable to provide a mechanism for dissipation of the overvoltage and/or overcurrent, e.g. by ESD, to which the IC may have been subjected. It is in particular the perception of the present invention that such problems have been especially pronounced in complementary metal oxide semiconductors (CMOS) field effect technologies, which require new considerations and approaches for overvoltage and/or overcurrent protection and dissipation.

It is an insight of the present invention that it is very difficult to protect the entrance port or terminal lug of an IC to be protected since modern MOS IC technology in the submicron range makes this target difficult because this technology uses very thin dielectrics which can be destroyed even on the occurrence of weak overvoltage and/or overcurrent events and the respective induced voltages.

It is furthermore an insight of the invention that overvoltage and/or overcurrent protection should use an efficient discharge path to conduct overvoltage and/or overcurrent around or away from an IC to be protected without causing damage to the IC. It is furthermore an insight of the present invention that such a discharge path is—on the upstream end, i.e., the end which is directed to the IC to be protected—connected to a terminal lug, whereas on a downstream end the discharge path is connected to an overvoltage and/or overcurrent protection structure. The protection structure is connected with its respective terminal to another discharge path which connects such protection structure to ground so that the discharge path has to be connected to a respective ground lug.

According to an insight of the present invention it is therefore desirable that protections being useful against such overvoltage and/or overcurrent events have to fulfill substantially two requirements. On one hand the protection should provide a discharge path that has a low resistance in order to keep the voltage drop during an overvoltage and/or overcurrent event small in order to avoid any harm to the IC or part of the IC to be protected.

On the other hand it is necessary that the discharge current is conducted to ground without harm or destroying the overvoltage and/or overcurrent protection circuit itself. Embodiments of the present invention fulfill these requirements.

It is a further insight of the present invention that protection devices e.g. SCR or ggNMOS devices frequently suffer from current crowding effects; the current is concentrated to one part of the protection device; this part can be called 'hot spot' or 'filamentation'. This is caused e.g. by a negative resistance behaviour which can be seen in such devices, and which behaviour can be called a 'snap back'. The hot spot has a lower resistance than the other parts of the protection device so that more current flows through the hot spot than through comparable parts of the protection device. The current density at the hot spot is higher than the current density at the other parts of the device. The current crowding reduces the robustness of the protection device because the current is not distributed evenly over the whole size of the protection device; at a total current level where the hot spot is already at the limit of its current carrying capability the other parts of the protection device carry less current than would be possible if the current was distributed evenly. Furthermore such devices have the disadvantage that they are not scalable, in other words that an increase in the size of the protection device does no more lead to an increase in the robustness of the device, e.g. the maximum current that can be handled by the protection device.

With embodiments of the present invention the current at such a hot spot is limited and the total current is more evenly distributed over the whole size of the protection device so that the robustness of the protection structure is improved and the maximum current that can be handled by the protection structure is increased.

It is a further insight of the present invention that such concentration of current at a certain point (hot spot) of an ESD protection circuit which is connected to a discharge structure is avoided because at each point at which the discharge structure is connected to an ESD protection circuit such point is connected to one of the discharge paths of such an embodiment whereas each of those discharge paths has a large resistance. The resistance of the discharge paths limits the current through the hot spot. In detail the current is limited to a value at which the total voltage drop along the hot spot and the discharge path connected to the area where that hot spot is located is identical to the voltage drop along all other discharge paths and their corresponding parts of the ESD protection. In that way the current is distributed more evenly.

Although each discharge path preferably has a high resistance the total resistance of the whole discharge structure can be kept small due to the fact that all discharge paths are connected in parallel.

An advantage of the use of the discharge structures as described is that it avoids or at least reduces to unsubstantial amounts the occurance of lateral currents in the protection device and the discharge structure; current flowing through a part of the protection device has to flow through the corresponding discharge path; no or only a very little amount of current will flow through the other discharge paths not directly connected to that specific part of the protection device. This advantage is of particular relevance if the ESD protection circuit has a lengthy finger-like structure because the present invention has realized that in particular in ESD protection circuits which have a lengthy finger-like structure the problem of the concentration of current at one point of the device and therefore the occurance of the undesired filament at such a point can be successfully avoided. Embodiments of the present invention provide the possibility to have an ESD protection circuit which can absorb an amount of current which amount is substantially proportional to the length measured in lateral direction of the ESD protection circuit.

Preferred embodiments of the invention are defined in the dependent claims.

A preferred embodiment discloses a structure in which the length and the conductivity per length of each of the discharge paths is substantially the same. This embodiment provides an easy implementation of the invention.

A preferred embodiment discloses a structure in which the length and the conductivity per length of at least a first one of the discharge paths is different from at least a second one of the discharge paths. This embodiment provides an enhanced flexibility because length and/or conductivity of each of the discharge paths of this embodiment can be chosen freely and can therefore be adapted to the special requirements of the desired device.

A preferred embodiment discloses a structure in which the conductivity per length of the first one of the discharge paths is adapted with respect to the second one of the discharge paths, so that a difference between the length of the first and the second discharge path is compensated. In this embodiment there is provided a compensation for different lengths of different discharge paths by adapting the conductivity per length of discharge paths which have different lengths to adjust the overall resistance of each of the discharge paths to the same amount.

A preferred embodiment discloses a structure in which the conductivity per length of at least a first one of the discharge paths is adapted with respect to at least a second one of the discharge paths by using a different path width for at least one of the different paths. This embodiment advantageously adapts the conductivity per length just by using different path widths for different paths which have different lengths so that their overall resistance would be different with respect to each other without such a compensation, by using a wider path width for a longer path as compared with the width of a shorter path. This embodiment has the advantage that the material which is used for the paths can be the same so that a large scale production of such path structures can be achieved cheap and easy.

A preferred embodiment discloses a structure in which at least one resistor is added to and/or integrated in at least one of the discharge paths to gain the desired resistance of the respective discharge path. By using simple and preferably discrete resistors as an addition to the discharge paths or being integrated in the discharge paths it is possible to easily provide the exact resistance per discharge path necessary.

As mentioned above another aspect of the present invention is an ESD protection device for an IC which comprises an ESD protection circuit and at least one discharge structure according to one of the aforementioned embodiments.

A preferred embodiment of this device discloses a structure in which the at least one discharge structure is connected to a downstream side of the ESD protection device. This is an easy implementation of the present invention.

A preferred embodiment discloses a structure in which the ESD protection circuit is provided in the shape of a substantially circular area or in the shape of a substantially closed loop, preferably a substantially closed ring, and on an upstream side of the ESD protection circuit there is provided a, preferably substantially circular, substantially closed discharge loop, preferably substantially shape of the ESD protection circuit, being connectable to a terminal lug connectable to the IC which is to be protected. In this embodiment the advantages of the present invention as described above are applied to a ring-like structure which ring-like structures have specific advantages because they do not require as much area as other structures and they have a high symmetry of the distribution of the current. Since the present invention in particular comprises also the perception that such ring-like structures are particularly vulnerable to a concentration of current at one point of the ring of the ring-like structure because of the vulnara of such ring-like structures for snap-back effect as described below the advantages of the present invention are particularly valuable for such ring-like structures.

A preferred embodiment discloses a structure in which the shape of the terminal lug is substantially concentric to the shape of the ESD protection circuit and/or the upstream discharge loop. In this embodiment the terminal lug is preferably also in a ring-like shape similar to the protection circuit and the discharge loop so that the advantages of the symmetry of such structure are further developed.

A preferred embodiment discloses an ESD protection device, wherein the device is designed to provide at least between about 8 and about 15 kV ESD protection, preferably for at least about 1000 ESD strikes. Accordingly, the very high requirements especially for computing and consumer products system level protection of up to about 15 kV at least for about 1000 strikes can be achieved.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE INVENTION

Figure 1:
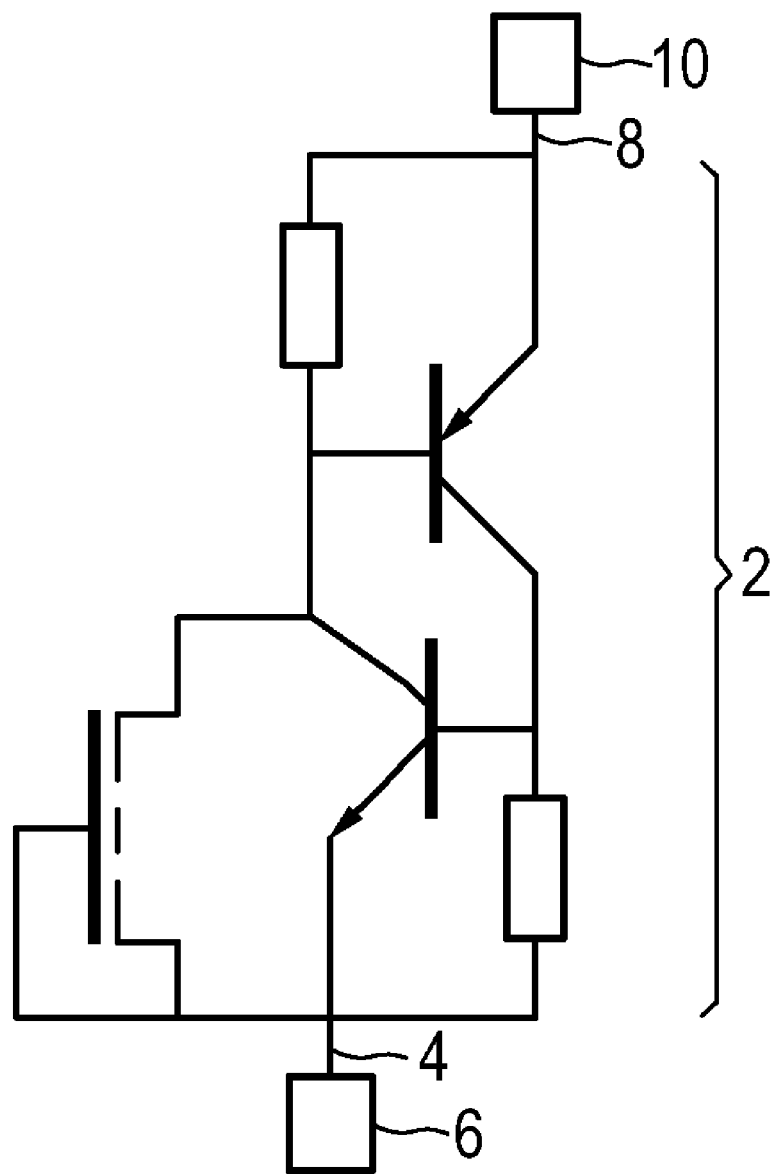
FIG. 1 shows a schematic illustration of an ESD protection circuitry according to the prior art using a low voltage silicon controlled rectifier (LVSCR)

The components in the drawings are not necessarily to scale, emphasize instead being placed upon clearly illustrating the principles of the present invention. Features that are substantially or functionally equal or similar will be referred to with the same reference sign(s).

FIG. 1 shows a schematic view on a illustration of an ESD protection circuitry according to the prior art using a LVSCR. The circuitry shows an ESD protection circuit 2 which is connected on a downstream side to a discharge path 4 which is connected to ground 6. The ESD protection circuit 2 is connected on the upstream side to an upstream discharge path 8 which is connected to a terminal lug 10.

Figure 2:
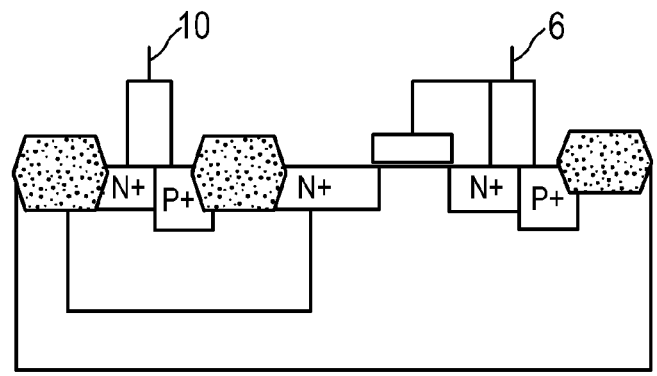
FIG. 2 shows a schematic illustration of an IC implementing the circuitry of FIG. 1.

FIG. 2 shows a schematic illustration of an IC implementing the circuitry of FIG. 1.

Figure 3:
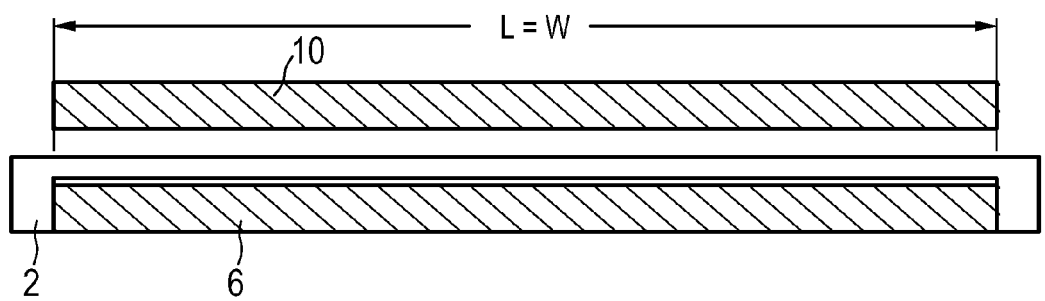
FIG. 3a-3e show other schematic illustrations of prior art.
Figure 3A:
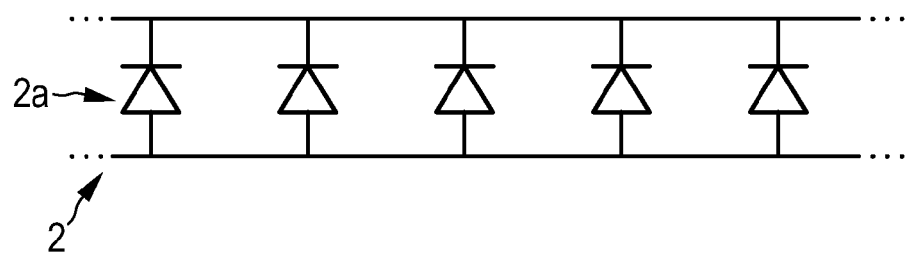
Figure 3B:
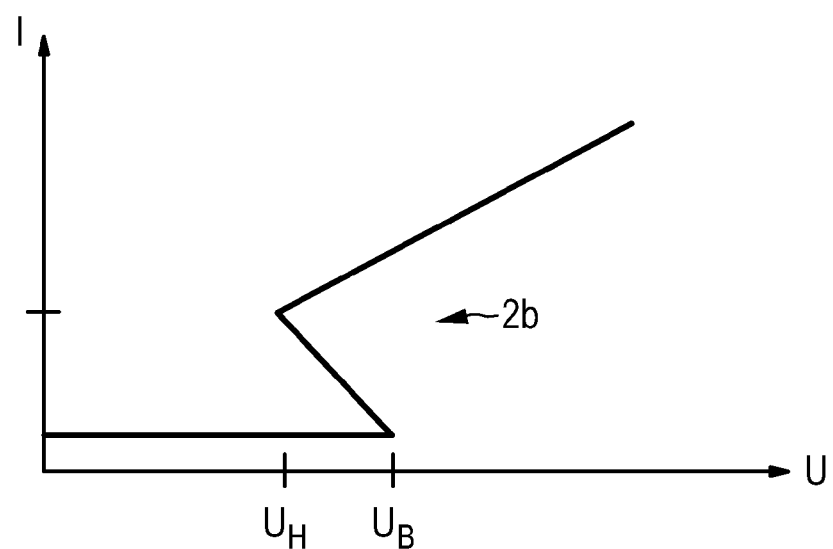

FIG. 3 shows a schematic illustration of the prior art of FIGS. 1 and 2 in which it can be seen that the effective width W of the conducting structure is identical to the lateral width L of the terminal lug 10. However, as outlined above in the description of the preferred embodiments the present invention comprises the perception that in such a prior art structure it can arise the problem that all the current in an overcurrent event is concentrated at one point along the length L of the ESD protection circuit 2. In this respect the present invention comprises the perception that the ESD protection circuit can be interpreted as a number of diodes 2a which are connected in parallel to eachother. This simplification of prior art ESD protection circuits 2 is shown in FIG. 3a. Although the interpretation of the prior art ESD protection circuits 2 as a number of diodes 2a which are connected in parallel is a rough simplification of the reality in such prior art ESD protection circuits 2 the present invention comprises the perception that this simplificated model can still describe the grounds for the problems of the prior art ESD protections circuits very well. This is because in the prior art circuits as shown in FIG. 3a nearly always the discrete parallel elements 2a of the prior art ESD protection circuits 2 have a characteristic curve which is shown in FIG. 3b. Those characteristic curves have a breakdown voltage $U_B$ but a negative resistance so that the current I is then increasing while the voltage U goes back to a holding voltage $U_H$ which is smaller then the breakdown voltage $U_B$. This effect caused by the aforementioned negative resistance of those elements 2a is called snap-back effect and is indicated by arrow 2b in FIG. 3b. At arrow 2b the voltage is then increasing together with the current. Because of the aforementioned snap-back effect of the single elements 2a of the prior art ESD protection circuits 2 as shown in FIG. 3a those circuits 2 have the problem as discussed above in connection with the preferred embodiments that all the overcurrent can concentrate on a single one of elements 2a so that the concentration of the current at a certain point is even enhanced due to the snap-back effect 2b as shown in FIG. 3b. This characteristic of the prior art ESD protection circuits 2 has a severe negative effect that the total amount of current which can be transported by such prior art ESD protection circuits 2 is limited by the current transport capacity of not much more then the current transport capacity of one single element 2a.

Figure 3C:
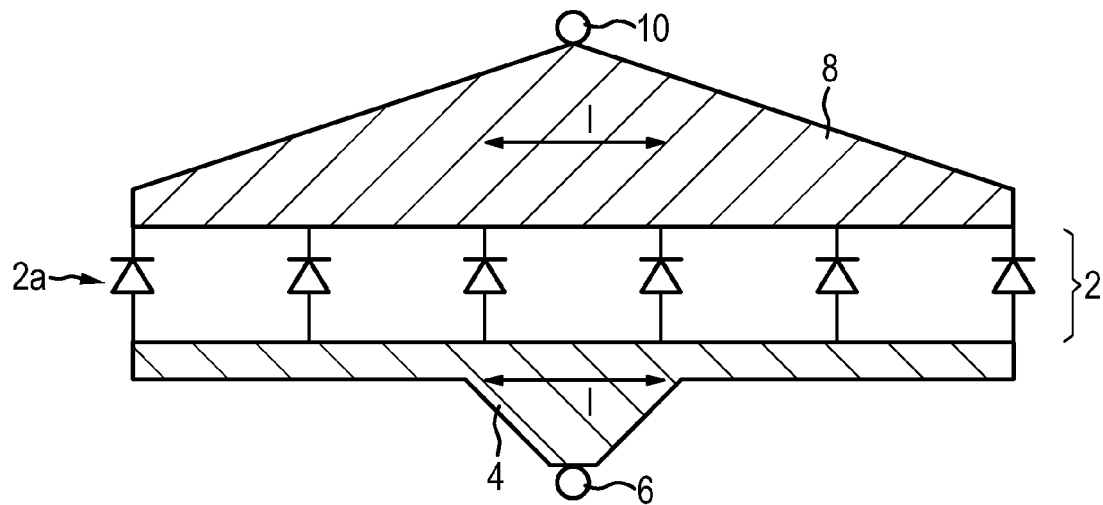

The aforementioned problem can not be avoided by the prior art structures since they only have one discharge path on the upstream side of circuits 2 and only one discharge path on the down stream side of circuit 2 as it is shown schematically in FIG. 3c. As shown in FIG. 3c it is possible for the current to flow in a lateral direction in discharge path 4 on the downstream side and in discharge path 8 on the upstream side as indicated by double headed arrows 1. Due to this possibility of lateral current flow in the discharge paths 4 and 8 the current can flow in lateral direction to an element 2a which is the first one of all elements 2a which goes into breakdown and therefore shows the snap-back effect and therefore even more concentrates a current at such point.

Figure 3D:
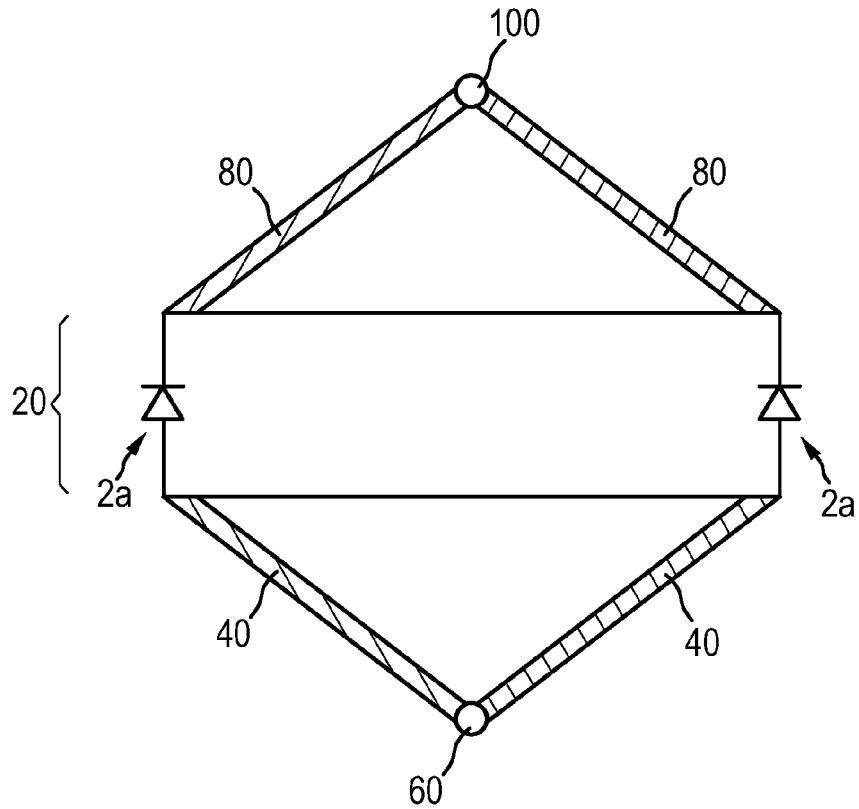

The aforementioned negative effects of the prior art structures as shown in FIGS. 1, 2, 3, 3a, 3b and 3c are avoided by the present invention of which an embodiment is shown in FIG. 3d. As shown in FIG. 3b there are two discharge paths 40 on the downstream and which connect the two discrete elements 2a of the ESD protection circuit 20 with ground 60 and there are also two discrete discharge paths 80 on the upstream side which connect the single elements 2a of the ESD protection circuit 20 with a terminal lug 100. According to the structure as shown in FIG. 3d it is not possible that a substantial amount of current is flowing laterally so the current cannot concentrate on a certain point along the width of the ESD protection circuit 20. Moreover since according to the present invention all discharge paths 40 among each other and all discharge paths 80 among each other, respectively, have substantially the same resistance it is also not possible that one of the discrete elements 2a of the ESD protection circuit 20 have to transport all the current of an overcurrent or ESD event.

Figure 3E:
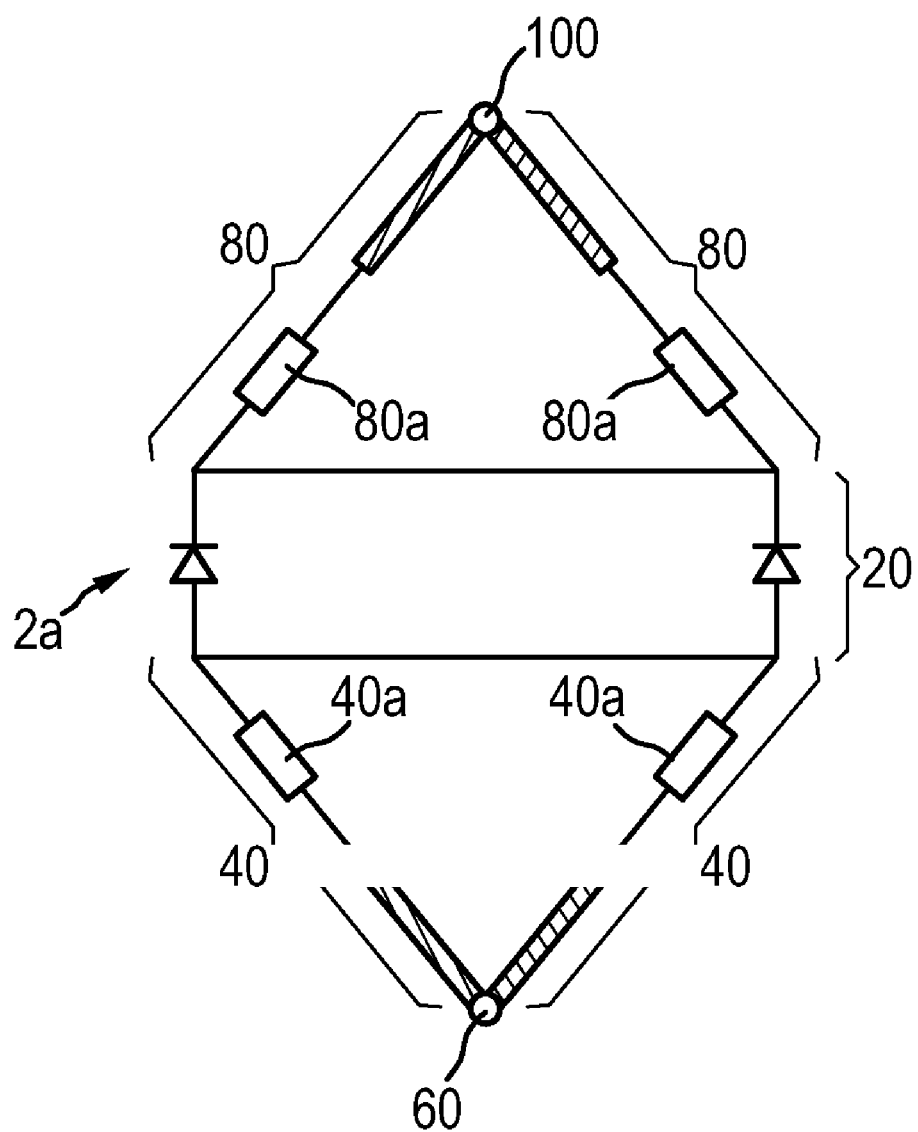

In FIG. 3e it is shown another embodiment of the present invention. In this embodiment of FIG. 3e each discharge paths 40 and 80 is provided with an additional discrete resistor 40a and 80a, respectively. These additional resistors 40a, 80a have high resistances so that the overall resistance of discharge paths 40 and 80 is also high. At the same time the total resistance of the upstream connection of the ESD protection circuit 20 to the terminal lug 100 and the total resistance of the downstream connection between ESD protection circuit 20 and ground 60 is correspondingly low due to the connection in parallel of discharge paths 40 and 80 a. Of course although not shown in FIGS. 3d and 3e as much discharge paths 40 and 80 can be connected in parallel as desired.

Figure 4:
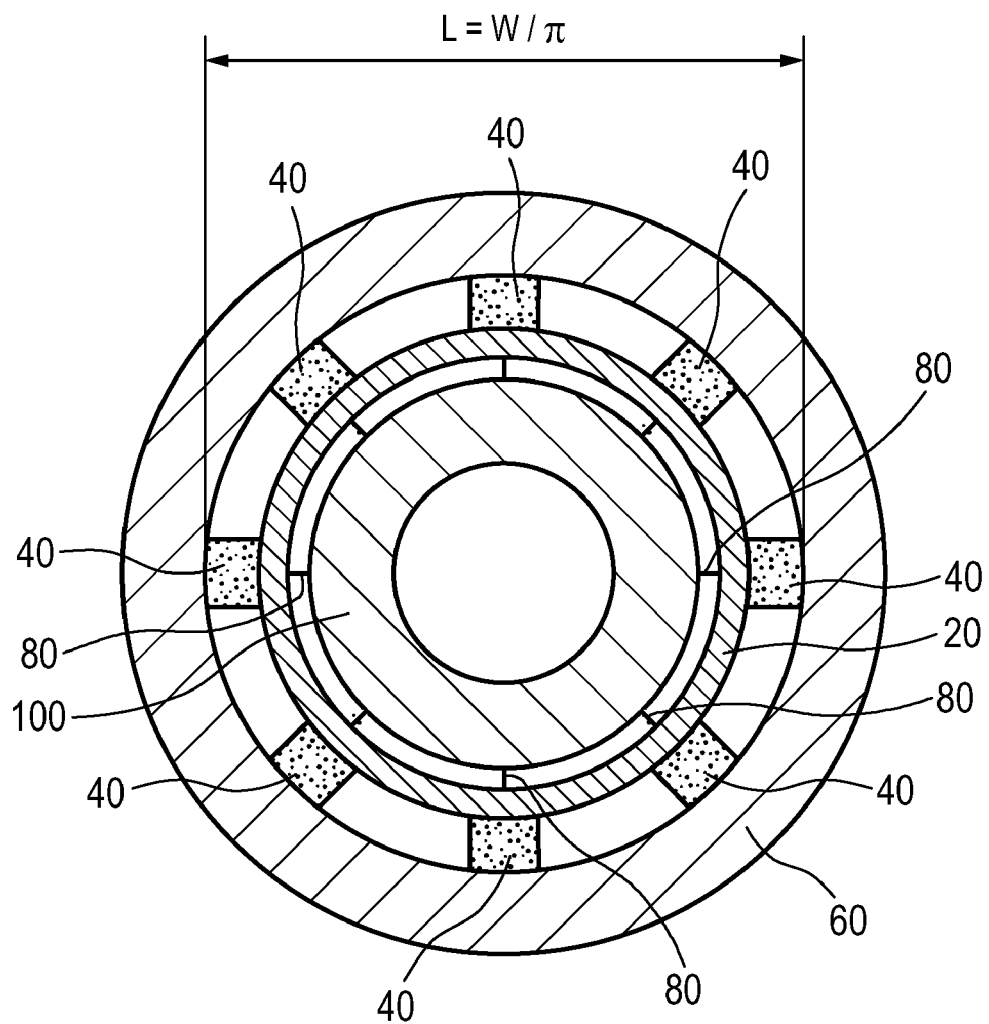
FIG. 4 shows a schematic perspective view on an embodiment of the present invention.

FIG. 4 shows a schematic perspective view on an embodiment of the present invention. It can be seen that the effective Size L of the conducting structure is the ratio of the lateral width W and pi. This is because the ESD protection circuit 20 is provided in the shape of a closed loop which is substantially circular whereas on the upstream side of the ESD protection circuit 20 there is provided a substantial circular terminal lug 100 which is substantially concentric to the loop-like shape of the ESD protection circuit 20 and which is connectable to a terminal lug being connectable to an IC which is to be protected by the device of FIG. 4. The shape of the ground 60 is substantially concentric to the shape of the ESD protection circuit 20 and also to the upstream terminal lug 100. As shown in FIG. 4 there are all together eight discrete discharge paths 40 connecting the ESD protection circuit 20 of this embodiment on the downstream side to ground 60 and there are also eight preferably equidistant discharge paths 80 connecting the ESD protection circuit 20 on the upstream side to the terminal lug 100. Of course although not shown each of the discharge paths 40 and/or 80 can be replaced by discrete resistors or such discrete resistors can be added to each one of the discharge paths 40, 80 as shown for example in the embodiment of FIG. 3e.

By the design of an ESD protection device according to FIG. 4 it is possible to have the maximum of symmetry for conducting the current of an ESD event and it is possible to avoid any negative peripheral effects so that such a structure has an enhanced performance per area compared with prior art structures according to FIGS. 1-3. Moreover the construction according to FIG. 4 provides that the lateral width L is reduced to a third of the lateral width L of a structure of the prior art according to FIGS. 1-3 if the same performance is desired.

Figure 7A:
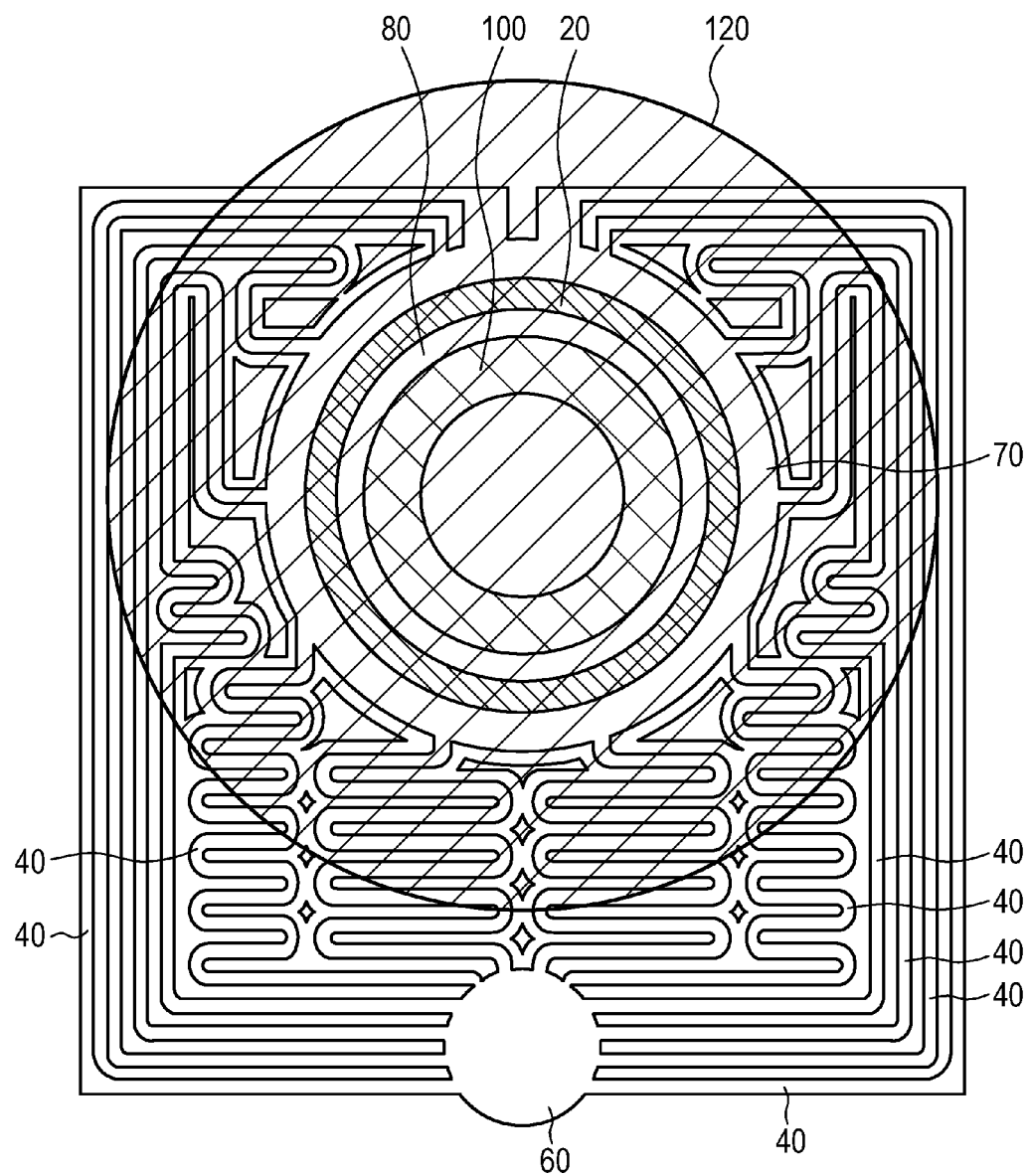
FIG. 7a shows a schematic perspective view on an embodiment of the present invention.

If a structure of FIG. 4 is used in a flip chip construction it is possible to place the whole structure under a terminal lug of the IC to be protected so that the area which is available under such terminal lug can be used advantageously for the ESD protection device with the design of FIG. 4. This is shown in FIG. 7a.

Figure 5:
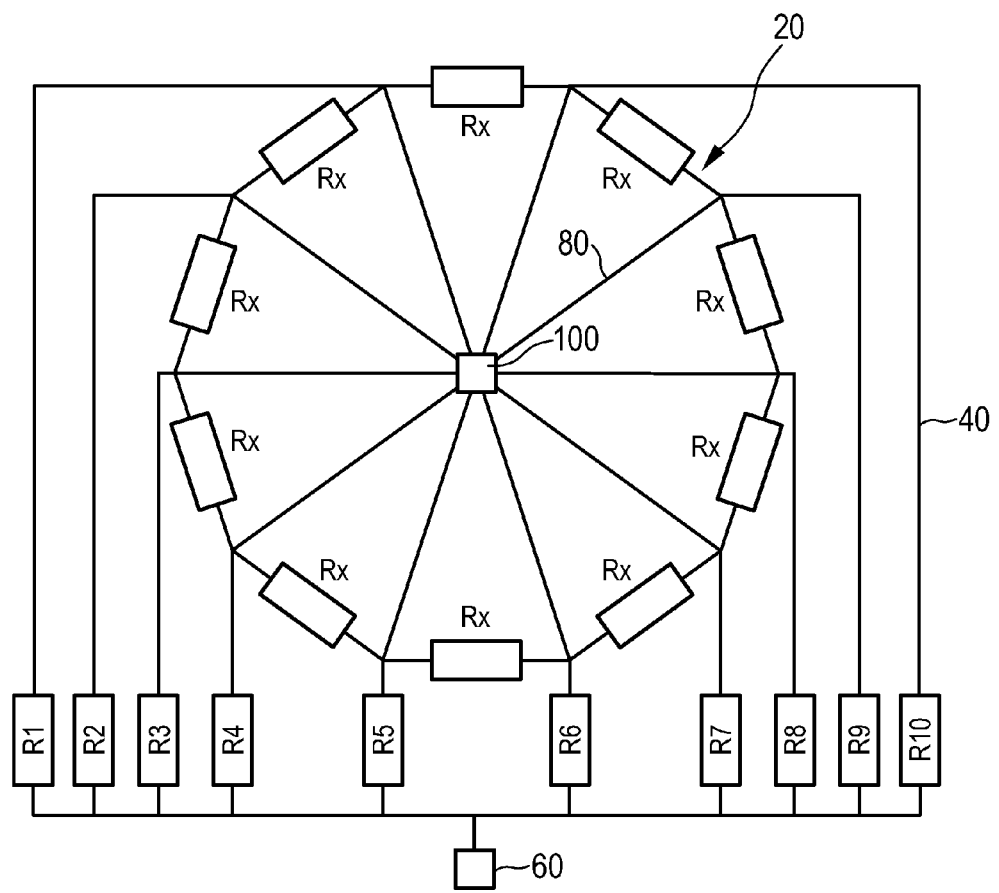
FIG. 5 shows a schematic perspective view on an embodiment of the present invention.

FIG. 5 shows a discharge structure for ESD protection for an IC according to an embodiment of the present invention. It can be seen that there are ten discharge paths 40 provided to conduct a current caused by an ESD event to ground 60 whereas substantially all of the discharged paths 40 present substantially the same resistance for the current of such an ESD event. It can be seen that the length and the conductivity of each of the discharge path 40 is different from another discharge path 40. However the conductivity per length of each one of the discharge path 40 is adapted with respect to the other discharge path by using resistors R1-R10 each having a different resistance to compensate the differences in the length of the paths 40 so that a difference between the length of the discharge paths 40 is compensated.

The discharge path 40 connect an ESD protection circuit 20 on the downstream side to ground 60. The internal conduction path within the ESD protection circuit 20 gives lateral resistances between the discharge paths 40 which are indicated by Rx in FIG. 5. These resistances Rx should preferably be big in order to limit lateral currents in that way limiting the current through a potential hot spot in ESD protection circuit 20.

On the upstream side the ESD protection circuit 20 is connected by a number of upstream discharge path 80 which also have all the same resistance. However, in the embodiment of FIG. 5 the discharge path 80 of the upstream side has the same resistance since they have all the same length and the same conductivity per length.

Figure 6A:
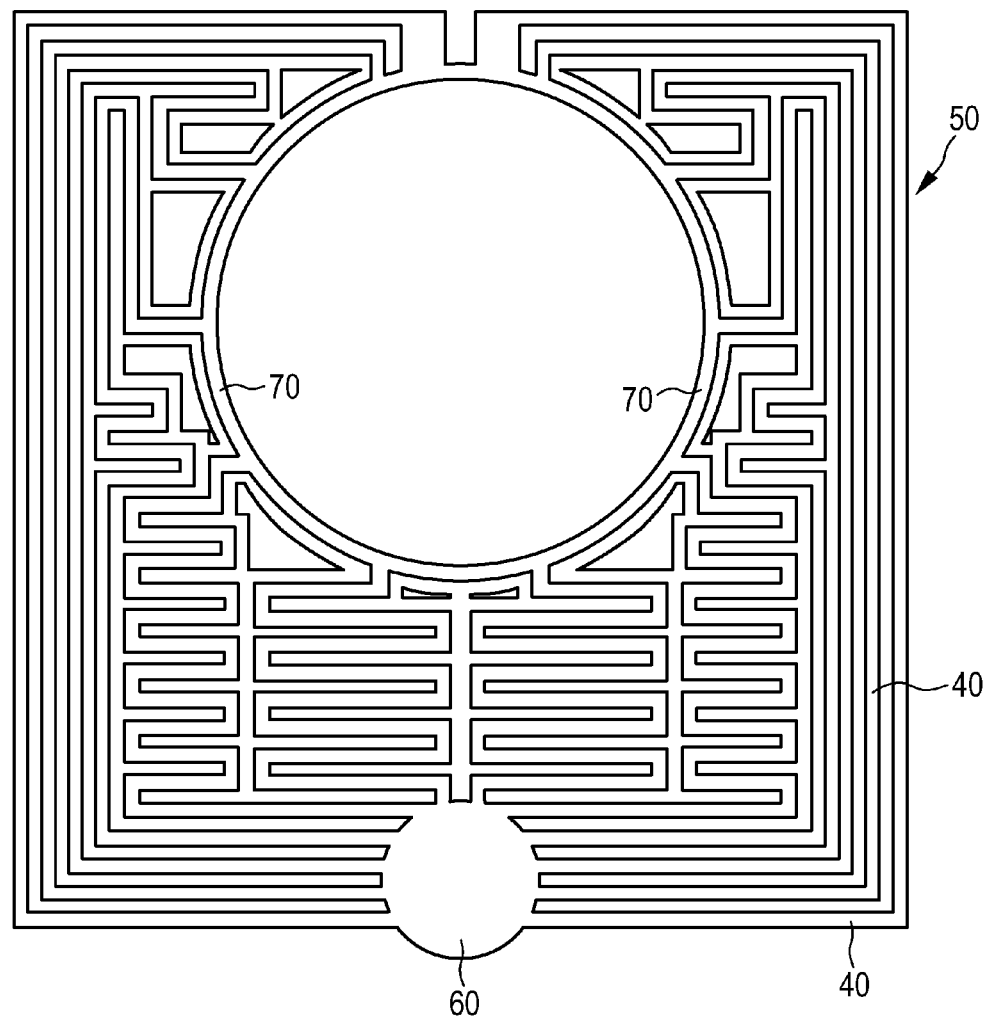
FIG. 6a shows a schematic perspective view on an embodiment of the present invention.

FIG. 6a shows another embodiment of the present invention. In FIG. 6a it is only depicted a discharge structure 50 for the downstream side with a number of discharge paths 40. Each discharge path 40 has the same length. This is provided by providing each discharge path 40 in a certain folded manner so that the length of each of a discharge path 40 is substantially the same even if the geometrical distance between opposite ends of the respective discharge paths 40 is not the same between ground 60 and the upstream end of the discharge paths 40 on a terminal ring 70. Terminal ring 70 can serve to connect the discharge structure 50 of FIG. 6a to an ESD protection circuit 20 of FIG. 5.

Figure 6B:
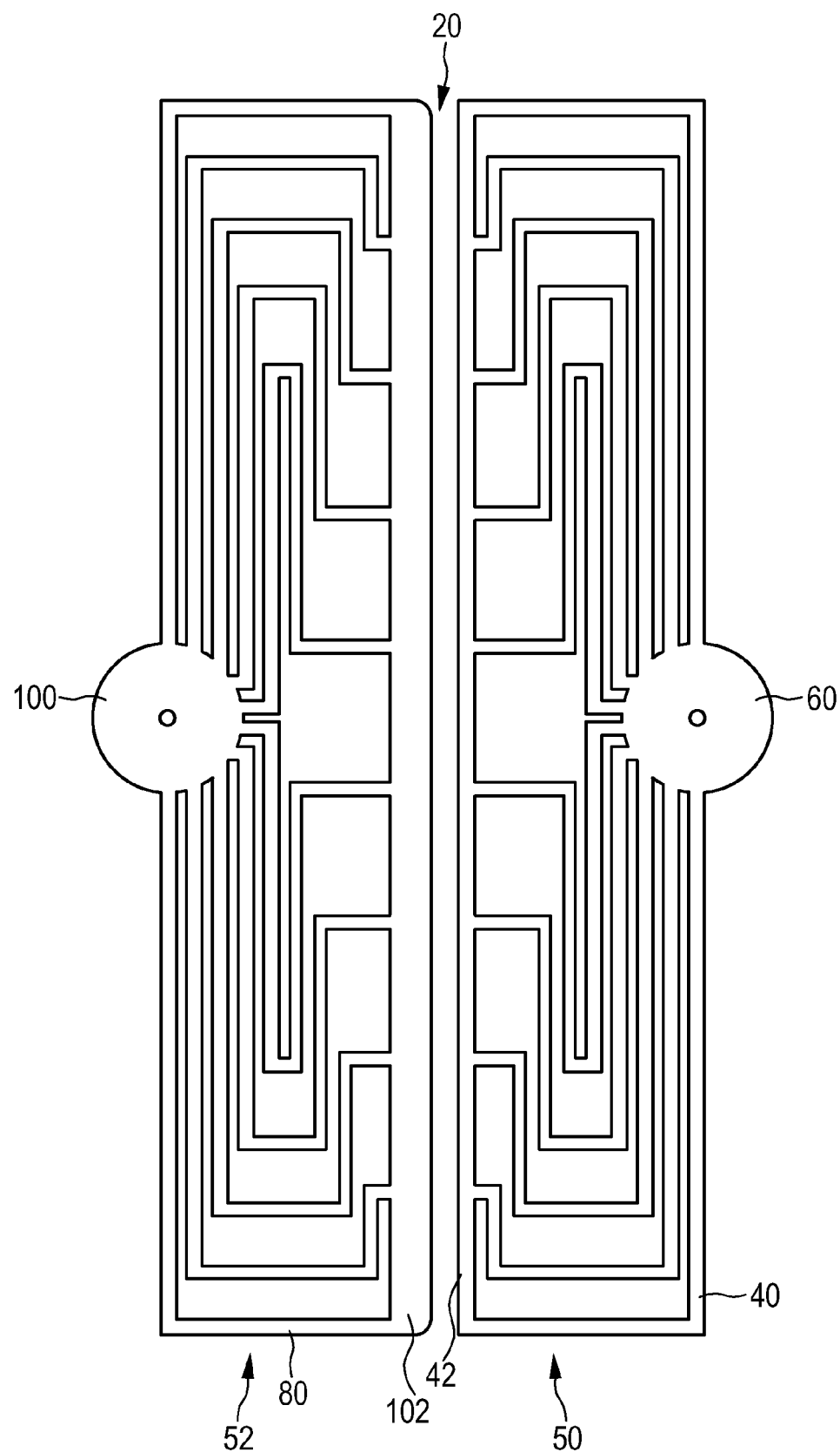
FIG. 6b shows a schematic perspective view on an embodiment of the present invention.

FIG. 6b shows another embodiment of the present invention. In the embodiment of FIG. 6b there is shown a ground 60 which is connected by an downstream discharge structure 50 comprising several discharge paths 40 to a terminal end 42 connectable to an ESD protection circuit 20.

On the upstream side of ESD protection circuits 20 there is a connecting lug 102 of upstream discharge paths 80 of an upstream discharge structure 52. Again each of the discharge path 80 has the same length due to folding of each of the discharge paths 80.

Although not shown in FIGS. 6a and 6b each of the discharge paths 40 and/or 80 could be replaced by one or several discrete resistors or such at least one resistors can be added to at least one of the discharge paths 40, 80 as shown for example in the embodiment of FIG. 3e to provide that each of the discharge paths 40 have substantially the same resistance and that each of the discharge paths 80 have substantially the same resistance.

Figure 7B:
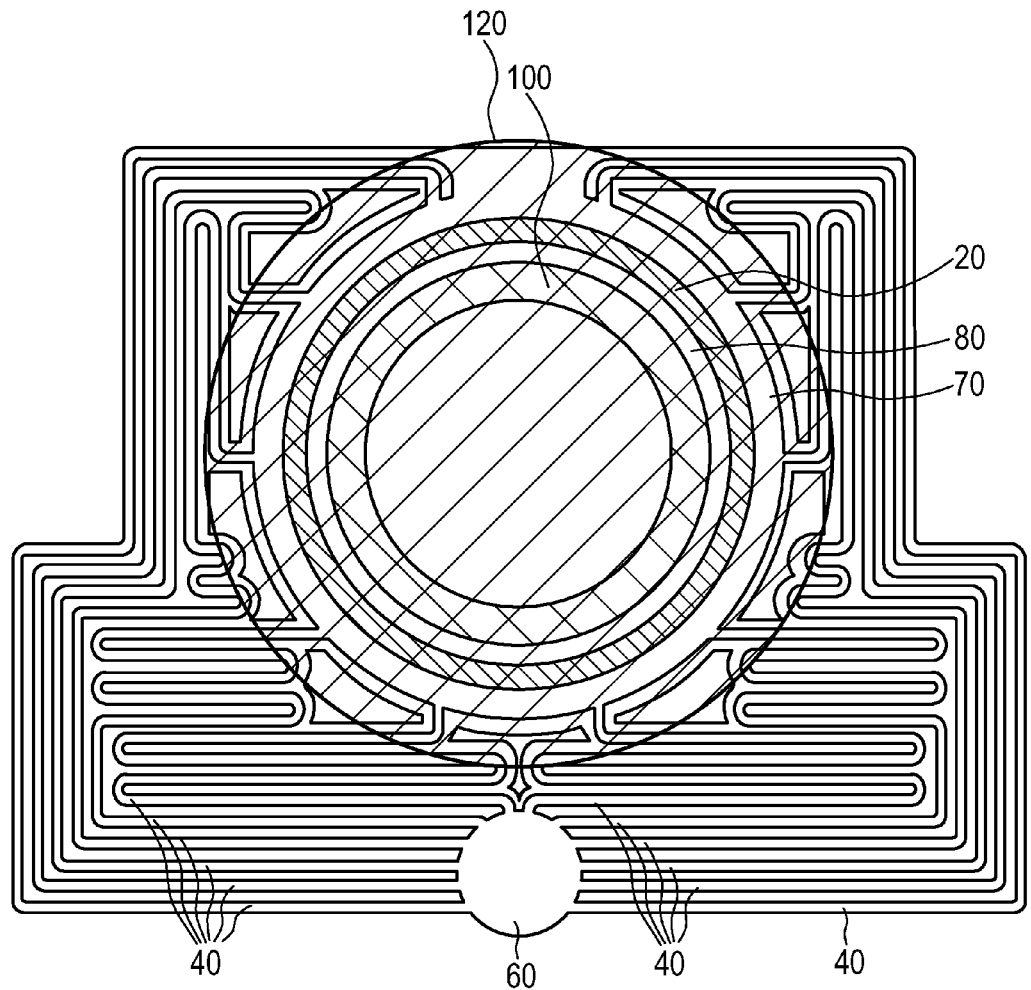
FIG. 7b shows a schematic perspective view on an embodiment of the present invention.
Figure 8:
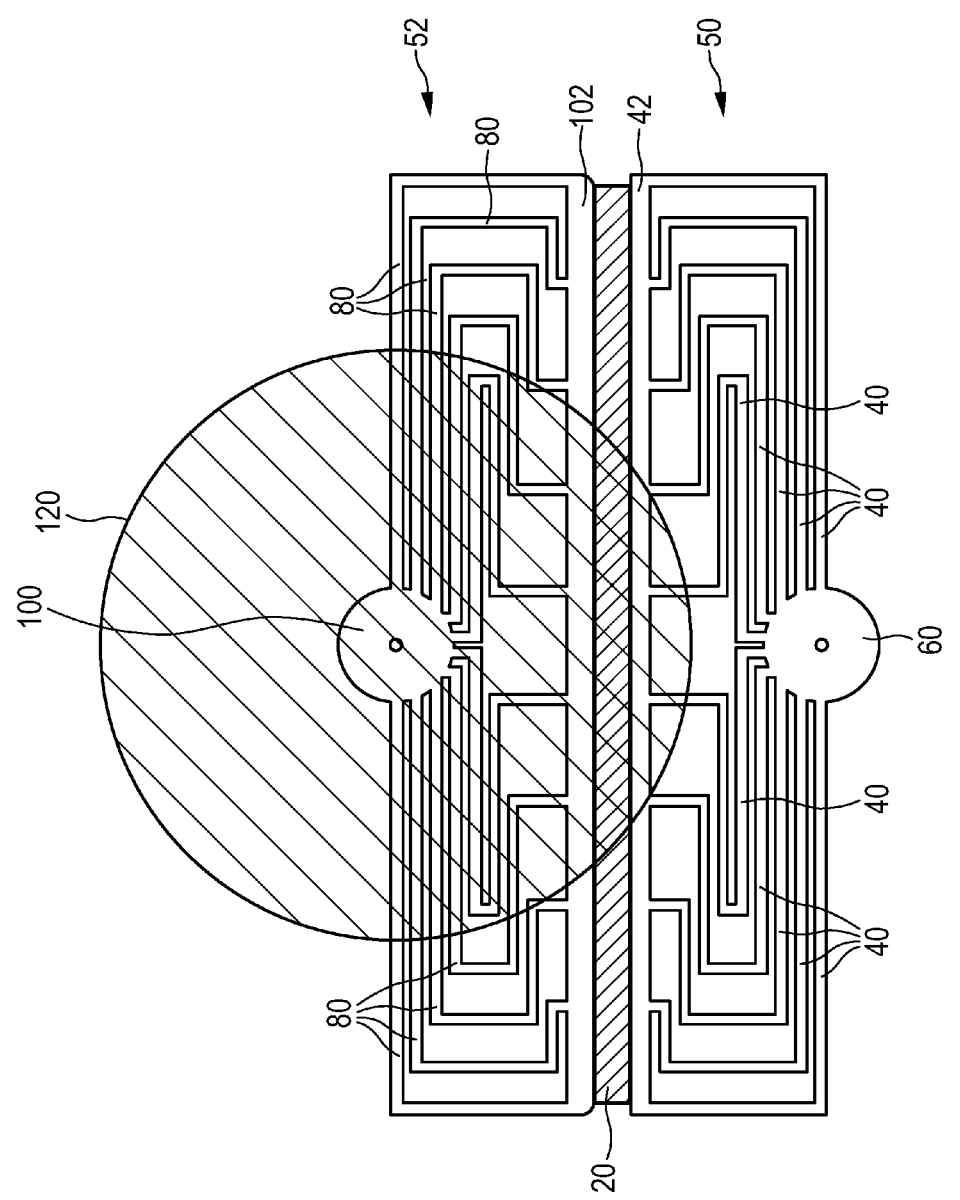
FIG. 8 shows a schematic perspective view on an embodiment of the present invention.

FIGS. 7a, 7b and 8 show other embodiments of the present invention. The embodiment of FIG. 7a is similar to the embodiment of FIG. 6a. However additionally it is shown an ESD protection circuit 20 connected to the terminal ring 70. Additionally it is shown a ring-like discharge path 80 on the upstream end of the ESD protection circuits 20 and being connected to the ESD protection circuits 20. Moreover it is shown a terminal lug 100 being connected to the discharge path 80 the terminal lug 100 also being a ring-like structure. The terminal lug 100 is connected to a concentric ball 120 which is lying on top of the whole ESD protection device as shown in FIG. 7a to connect the ESD protection device FIG. 7a to an IC to be protected in a flip-chip-manner.

As similar structure as in FIG. 7a is shown in FIG. 7b. Although the local structure of path 40 is different from the local structure of path 40 in FIG. 7a the principle of adapting the length of each of the different paths 40 to provide the same conductivity per length for each of the different discharge paths 40 is the same as in the embodiment of FIG. 7a. Again there is provided a ball 120 lying on top of terminal lug 100 for connection purposes.

The structure as shown in FIG. 8 is similar to the structure as shown in FIG. 6b. In addition to FIG. 6b there is shown a ball 120 which is lying over and concentric to the terminal lug 100 for connection purposes.

Although not shown the terminal end 42 of the downstream discharge structure 50 can be replaced by discrete resistors to connect ground 60 only at discrete points to the ESD protection circuit 20. In the same manner it is possible to replace connecting lug 102 on the upstream side of the ESD protection circuits 20 by discrete resistors which then connect the ESD protection circuit 20 at discrete points to the discrete discharge paths 80.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A planar discharge structure for an overvoltage and/or overcurrent protection for an IC, in particular for an ESD protection for an IC, comprising:
   at least two discharge paths provided to conduct a current to a terminal, wherein substantially all of the discharge paths present substantially the same resistance for the current,
   wherein the geometrical distance between opposite ends of the respective discharge paths is not the same.

2. Structure as claimed in claim 1,
   wherein the length and the conductivity per length of each of the discharge paths is substantially the same.

3. Structure as claimed in claim 1,
   wherein the length and the conductivity per length of at least a first one of the discharge paths is different from at least a second one of the discharge paths.

4. Structure as claimed in claim 1,
   wherein the conductivity per length of the first one of the discharge paths being adapted with respect to the second one of the discharge paths, so that a difference between the length of the first and the second discharge path is compensated.

5. Structure as claimed in claim 1,
   wherein the conductivity per length of the first one of the discharge path being adapted with respect to the second one of the discharge paths by using a different path width for at least one of the different paths.

6. Structure as claimed in claim 1,
   wherein at least one resistor is added to and/or integrated in at least one of the discharge paths to gain the desired resistance of the respective discharge path.

7. ESD protection device for an IC, comprising:
   an ESD protection circuit and at least one discharge structure according to claim 1.

8. Device as claimed in claim 7, wherein the at least one discharge structure is connected to a downstream side of the ESD protection device.

9. Device as claimed in claim 8, comprising:
   at least two discharge structures, whereas the first discharge structure is connected to a downstream end of the ESD protection circuit, and a second discharge structure is connected to an upstream end of the ESD protection circuit.

10. Device as claimed in claim 8,
    wherein the ESD protection circuit is provided in a shape selected from the following:
    a substantially circular area;
    in the shape of a substantially closed loop; or
    a substantially closed ring;
    wherein on an upstream side of the ESD protection circuit there is selected from the following:
    a substantially circular discharge loop;
    a substantially closed discharge loop;
    a substantially adapted form in the shape of the ESD protection circuit, and
    wherein, the upstream side of the ESD protection circuit is connectable to a terminal lug connectable to the IC which is to be protected.

11. Device as claimed in claim 10,
    wherein the shape of the terminal lug is substantially concentric to the shape of the ESD protection circuit and/or the upstream discharge structure.

12. PCB comprising a discharge structure as claimed in claim 1.

13. Electronic device, comprising the PCB as claimed in claim 12.

14. Method for making a discharge structure, the discharge structure according to claim 1, the method comprising:
    providing at least two discharge paths being able to conduct a current to a terminal, and
    ensuring that substantially all of the discharge paths present substantially the same resistance for the current.

15. Method as claimed in claim 14, further comprising:
    manipulating at least one of the discharge paths, by providing said discharge path in an at least one-time folded manner and/or by using at least one resistor being added to and/or integrated in the discharge path, so that the resistance of each of the discharge paths is substantially the same even if the geometrical distance between opposite ends of the respective discharge paths is not the same.

* * * * *